United States Patent [19]

Schaible et al.

[11] 4,132,586

[45] Jan. 2, 1979

[54] SELECTIVE DRY ETCHING OF SUBSTRATES

[75] Inventors: Paul M. Schaible; Geraldine C. Schwartz, both of Poughkeepsie, N.Y.; Laura B. Zielinski, New Fairfield, Conn.

[73] Assignee: International Business Machines Corporation, Armonk, N.Y.

[21] Appl. No.: 862,262

[22] Filed: Dec. 20, 1977

[51] Int. Cl.² .............................................. C23F 1/02
[52] U.S. Cl. .................................... 156/643; 156/659; 156/667; 156/904; 204/192 EC; 204/192 E
[58] Field of Search ............ 204/192 EC, 192 E, 298, 204/164; 156/643, 654, 656, 659, 667, 904; 29/580, 625

[56] References Cited

U.S. PATENT DOCUMENTS

| 3,455,020 | 7/1969 | Dawson et al. | 29/571 |
| 3,794,536 | 2/1974 | Muska | 156/643 |
| 4,004,044 | 1/1977 | Franco et al. | 156/659 X |
| 4,008,111 | 2/1977 | Rutz | 156/667 X |

Primary Examiner—William A. Powell
Attorney, Agent, or Firm—Henry Powers

[57] ABSTRACT

Magnesium oxide is deposited on a substrate as a mask with a pattern of openings which exposes a corresponding pattern of a surface of a substrate which is to be subjected to dry etching.

In a specific application, the magnesium oxide mask is employed to delineate a conductor pattern on semiconductor substrates by dry etching.

16 Claims, 7 Drawing Figures

SELECTIVE DRY ETCHING OF SUBSTRATES

FIELD OF THE INVENTION

This invention relates to an improved mask for selective removal of material at exposed surfaces of a substrate and, more particularly, to the use of the improved mask for delineating conductor patterns on semiconductor substrates by dry etching techniques.

DESCRIPTION OF THE PRIOR ART

Aluminum and aluminum alloys are widely used for metal interconnections of conductor patterns in integrated circuits, and fabrication of circuit devices requires methods for delineating patterns in metal films to obtain the desired conductor pattern. As circuit density increases, the metal interconnection lines must become narrower and more closely spaced. Also, in applications for large scale integration, the metal film or pattern is usually required to be thicker in order to have sufficient current carrying capacity. These requirements cannot be met by conventional chemical subtractive etching if used to define the metal patterns and, as a result, in recent years interest in dry etching techniques has been increasing for forming metallization patterns in integrated circuit fabrication. Certain dry etching processes are employed where it is required that the walls of the etched pattern be vertical. Such directional etching processes involve ion bombardment and/or ion assisted chemical reactions: rf sputter etching, ion beam milling, and reactive ion etching (sometimes called reactive sputter etching). All these use gas plasmas excited by the application of a radio frequency voltage; the frequency range of 13.56 to 40.63 MHz is used most commonly, but other frequencies can be employed.

Another dry process, reactive plasma etching, is used to avoid wet processing and minimize mask undercut. This process involves free radical chemical etching and is isotropic. The free radicals are generated in a plasma excited by the application of a radio frequency voltage, usually either 50 KHz or 13.56 MHz, but other rf frequencies can be used; microwave excitation has also been employed.

Such processes are used for etching of metallization interconnection patterns, contact or via holes in $SiO_2$, $Si_3N_4$, polyimide, and the like, and also for etching deep grooves or moats in silicon for isolation, and for etching deep holes in silicon or silicon dioxide for ink jet applications, and the like.

In these dry etching systems, the surface to be etched is covered with a suitable mask, and placed in the dry etching environment. In directional etching processes, in order to obtain the vertical side walls, especially when small dimensions and/or deep etching are required, the etch mask must meet several requirements, e.g. it must not etch at an appreciable rate, it must not cause formation of back-scattered residue, it must not degrade in the plasma, it must not flow or deform at elevated temperatures which can exist either because of ion bombardment or need for elevated temperature to increase the volatility of reaction products of plasma reactions, it must be reproducibly of uniform thickness across the pattern to prevent edge degradation. In plasma etching, all of the above requirements, except those concerned with the effects of ion bombardment, must also be met. Also, where small dimensions are required, the masking technique should also be compatible with E-beam lithography. In addition, the mask must be capable of being completely removed without attack of the etched pattern or the underlying substrate. Also, for usefulness in commercial manufacturing processes, the removal of the mask should be accomplished in a relatively short time, and preferably in a non-corrosive environment.

In this regard, in the delineation of metallic conductor patterns from aluminum and alloys thereof, with which this invention is illustrated, there are two major problems associated in dry etching thereof, particularly in etching such patterns from aluminum copper alloys as by reactive ion etching. The first problem is that masks currently in use actually etch at a fairly rapid rate during the etching of the metallurgy and degradation of the metal pattern occurs. The second problem is that some of the masking techniques used are not completely compatible with E-beam lithography: the use of thick resists leads to charging and registration problems during exposure and differential solubility problems during development. None of the existing masking techniques, inclusive of the use of resists of various kinds including those with various surface modifications, subtractively etched oxides, and aluminum oxide, meet all of the foregoing requirements.

SUMMARY OF THE INVENTION

It is accordingly an object of this invention to provide an improved etch mask for dry etching of substrates.

It is another object of this invention to provide an improved etch mask substantially inert in dry etching environments.

Another object of this invention is to provide a novel etch mask which will not be significantly degraded in dry etching environments.

Another object of this invention is the use of a novel etch mask in dry etching processes which will not result in formation of back-scattered residue.

A further object of this invention is the use of a novel etch mask in dry etching processes which will not flow or deform at elevated temperatures which can result from ion bombardment or are required to increase volatility of reaction products of plasma attack.

Also, it is an object of this invention to provide a novel etch mask compatible with E-beam lithography.

Also, it is an object of this invention to provide a novel etch mask for dry etching processes which can be completely and rapidly removed in a substantially non-corrosive environment.

In accordance with this invention, it has been found that a magnesium oxide (MgO) mask meets all of the foregoing requirements and objectives in dry etching of substrates and/or films thereon. The magnesium oxide can be formed on a substrate through openings of a thin lift-off mask which is subsequently removed. The lift-off technique is known, and can be found described in U.S. Pat. Nos. 3,421,206, 3,873,361, 3,934,057, 3,982,943 and 4,004,044.

Alternately, a pattern can be formed in the MgO film by subtractive etching. A thin layer of MgO is deposited on the substrate. The appropriate pattern is defined in a relatively thin appropriate resist material by either optical or E-beam lithography. The unmasked MgO regions are etched in a saturated solution of ammonium oxalate at room temperature and the resist then removed in the usual way.

In accordance with this invention for purposes of fabricating semiconductor devices, a blanket layer of a conductive metal, such as an aluminum-copper alloy, is deposited, as by evaporation or sputtering, over an integrated circuit structure including any insulating layers thereon, such as silicon dioxide. This is followed by deposition of an organic polymer blanket layer, such as an appropriate resist, followed by exposure and development, using standard photo or electron beam lithographic techniques, to provide a pattern of openings of the desired conductor pattern. A blanket layer of magnesium oxide is then deposited, as by evaporation, over the retained resist and exposed metal layer, followed by removal of remainder of the resist together with its overcoating of magnesium oxide in a suitable solvent. This leaves behind a magnesium oxide mask corresponding to the desired metallization pattern. The exposed metal in the openings of the MgO mask is then removed by dry etching techniques, followed by removal of the MgO mask in a suitable solvent such as a solution of oxalic acid, ammonium oxalate, acetic acid, and the like.

DESCRIPTION OF PREFERRED EMBODIMENTS

Figure 1A:
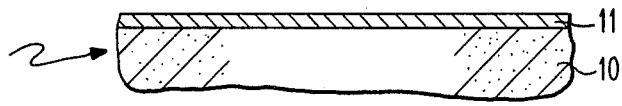
FIGS. 1A to 1G are diagrammatic cross-sectional views of a structure as well as various steps during its fabrication in accordance with a preferred embodiment of this invention, as well as a flow chart describing the steps.
Figure 1B:
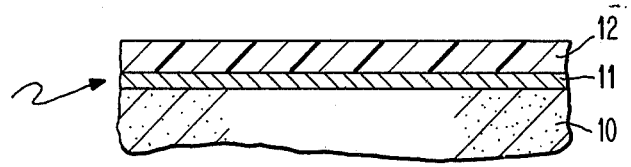

With reference to FIG. 1A, the substrate 10 can comprise a silicon dioxide layer such as is formed on semiconductor wafer (not shown) during device fabrication. Normally, such wafer will contain at least one integrated circuit formed by conventional device fabrication techniques, inclusive of ohmic contacts, not shown.

Next, a blanket layer 11 of a functional conductive metal is deposited, as by vacuum evaporation, sputtering and the like, over the surface of the structure. This metallic film can be any metal conventionally used for integrated circuit metallization, such as aluminum, aluminum-copper alloys, platinum, palladium, tantalum, chromium, tungsten, titanium, gold, hafnium, and the like. For purposes of illustration, this metal film 11 can comprise a 10,000Å thick layer of 96% aluminum — 4% copper alloy.

Next, a layer 12 of lift-off masking material is coated on the metal film 11. This masking material is characterized as an organic polymeric material which can comprise standard photo or electron beam resists which can be applied in any conventional manner, as by spin coating. As indicated, the resist can comprise any optical or E-beam sensitive resist which preferably will comprise a radiation degradable resist, inclusive of two-coat polymethylmethacrylate polymers, copolymeric resists and the like, such as described in the above-noted patents directed to lift-off techniques. Other suitable resists include Shipley's AZ-1350J, Kodak's KTFR, synthetic resins such as polyvinyl cinnemate, diazo type resists, and the like.

Figure 1C:
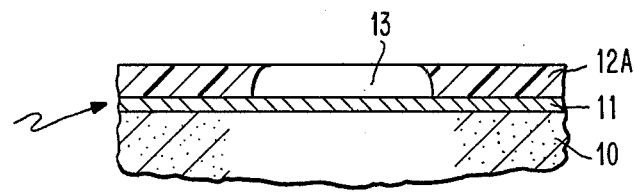
Figure 1D:
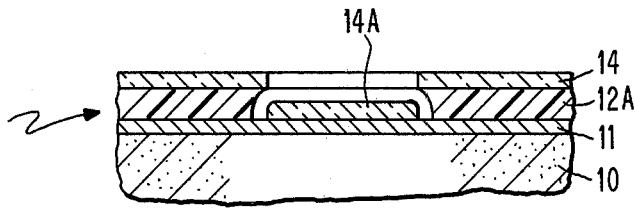
Figure 1E:
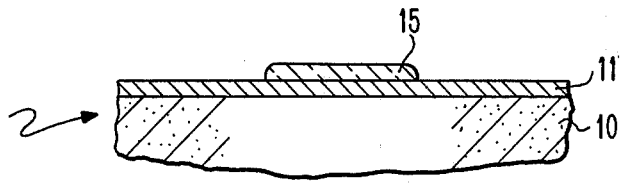
Figure 1F:
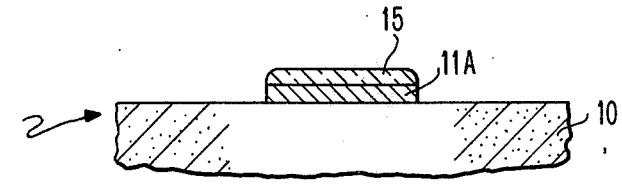
Figure 1G:
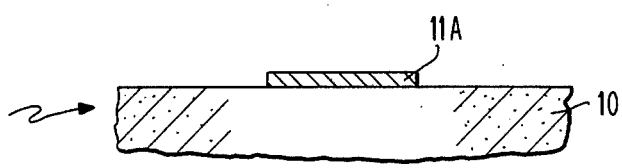

This masking material is processed into a lift-off mask 12A with a pattern of openings 13, as in FIG. 1C, by exposure and development in accordance with conventional lithographic techniques well known in the integrated circuit fabrication art.

In the next operation, a 2000Å layer 14 of magnesium oxide is evaporated on top of the lift-off mask 12A and on the exposed portions of the metal film 11, as indicated by the segments 14A, which will eventually comprise the MgO dry etch mask 15.

Next, utilizing conventional lift-off removal techniques, the remaining portions of the resist mask 12A are completely removed by suitable solvents or etchants which also carry away the overlying magnesium oxide coating to leave behind the magnesium oxide segments 14A forming a dry etch mask 15 on the surface of the metal film 11. For a positive resist such as AZ-1350J, it can be removed by immersion in a solvent such as N-methylpyrrolidone. Normally, it is only necessary that the solvent be one which dissolves or swells the polymeric material without affecting the magnesium oxide material or the metallic film. Other solvents which can be used include acetone, butylacetate, trichloroethylene, cellosolve acetate, and the like.

The magnesium oxide masked structure is then subjected to dry etching processes for removal of the exposed portions of metal film 11 down to the substrate 10. For example, the structure can be dry etched by reactive ion etching at 0.3 watts/cm$^2$ at 27MHz in CCl$_4$/Ar ambient in accordance with the system described in U.S. Pat. No. 3,994,793.

After dry etching of the exposed metal film, the magnesium oxide mask 15 is removed in a suitable solvent or etchant, as for example, by immersion for two minutes in a warm (40°–50° C.) 8% aq. solution of oxalic acid.

Removal of the magnesium oxide mask 15 leaves the masked portions of metal film 11 in the desired pattern configuration 15A.

It may be noted that the erosion rate of the magnesium oxide mask in CF$_4$, CCl$_4$/Ar, Cl$_2$/Ar and Ar plasma is very low, see Table I below, and unexpectedly substantially lower than the erosion rate of Al$_2$O$_3$.

TABLE I

| | REMOVAL RATES (Å/minute) | | |
|---|---|---|---|
| | | Mask Material | |
| Dry Etching Conditions | MgO | SiO$_2$ | Al$_2$O$_3$ |
| 1.6 W/cm$^2$, 50μAr, 13.56MHz | 15 | 65 | 25 |
| 1.6 W/cm$^2$, 50μCF$_4$, 13.56MHz | 50 | 1000 | 200 |
| 0.3 W/cm$^2$, 2μCCl$_4$/8μAr, 27MHz* | 20 | 200 | 100 |

*Reactive ion etching process of U.S. Pat. No. 3,994,793

The literature (e.g. H. Bach, Naturwissenschafter, 1969, 55(9), 439) reports that in a 5.6 Kev Ar$^+$ beam, MgO sputters at twice the rate of Al$_2$O$_3$ and at about the same rate as "low quartz". However, in sputtering systems, the energies are in the 500 volt region. Any attempt to find a rational basis for sputtering rates of compounds in the literature relates sputtering yield to the heat of formation of the compound, e.g. the low sputtering yield of Al$_2$O$_3$ is explained by the very large negative heat of formation of the compound. On this basis, the low sputtering rate of MgO, at the lower energies of sputtering systems (compared to the ion beam referred to above) is unexpected. Even if one assumed the conversion of the surface oxide to the corresponding halide in a halogen-containing plasma and examined the relative heats of formation as a basis of predicting the sputtering rates of the involatile halides, the aluminum compounds would have the lower erosion rates.

Because the erosion rate is very low, a MgO film thickness of 2000Å is adequate for most purposes, e.g. interconnection metallization pattern formation, silicon isolation grooves, holes in dielectric materials. This means that the resist used as the lift-off structure can be thin ($\approx$7000Å). This minimizes charging problems in E-beam exposure, minimizes E-beam resist development problems and yields better pattern definition. Another advantage of using a thin layer of MgO is that in subtractive etching of MgO, there will be a very close replication of the resist mask.

MgO is an inorganic compound with a melting point of 2852° C. so that no flow, deformation or degradation will occur during dry etching. The thin MgO layer although thin, is free of pinholes. No resist layers are exposed to the plasma; they are removed easily before dry etching. If the surface of the MgO is converted to the corresponding halide in the halogenated plasmas, the fluoride is involatile and the chloride has a vapor pressure that is much lower than aluminum and copper chloride, for example. Therefore, one would not expect significant loss through vaporization. However, it appears that it is the unexpectedly low sputtering rate of the surface layers that is important since there is no backscattered residue as seen, for example, in the case of aluminum masking during dry etching of $SiO_2$ in $CF_4$ by reactive ion etching.

Because the MgO mask can be formed by either a lift-off or a subtractive etching process, in the dry etching of interconnection metallization patterns, the image can always be formed by positive writing by E-beam in a positive resist. The pattern factor will determine whether a lift-off or a subtractive etch image will be written. This is a cost and/or throughput advantage for E-beam lithography.

MgO is soluble in oxalic acid, a non-corrosive acid (in the context of waste disposal). Metals, such as Al, Cu, Cr, Ti, W, Ta, Au, etc., and silicon, $SiO_2$, $Si_3N_4$, polyimide, etc. are not etched by oxalic acid so that mask removal is safe, quick, and poses no environmental problems.

The use of a non-erodible, transparent mask such as MgO, also makes it possible to use a simple interferometric technique for monitoring the etch rates in-situ of opaque materials. Since MgO has a low sputter etch rate in argon, it can be used in sputter etching and ion milling as well as in reactive ion etching.

Although other materials such as $Al_2O_3$, $SiO_2$, SiO can be deposited through a lift-off mask and can be used in RIE (only $Al_2O_3$ is useful as a mask in a $CF_4$ plasma while all can be used in chlorinated plasmas) MgO is the only material that can be used predictably with metals. The $Al_2O_3$, as deposited, is crystalline, and while soluble in phosphochromic acid under the deposition conditions we have used, might become more ordered in structure in other circumstances which would make it insoluble in the etch that does not attack aluminum. The $SiO_2$ requires buffered HF for dissolution and this can lead to substrate attack as well as the possibility of metal attack. $SiO_2$ is soluble only in $HF/HNO_3$ mixtures which can also lead to substrate attack. Also, their higher erosion rates lead to the requirement that, for equal protection, thicker masks are required if they were used in place of MgO. Then this may lead to the requirement of thicker resists with the problems accompanying that need. Therefore, MgO is a unique masking material for dry etching.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A process for selective removal of material from a substrate comprising:
   forming a superimposed mask of magnesium oxide on a surface of a substrate exposing discrete areas of said surface, and
   removing material from said masked substrate at said exposed discrete areas.

2. The process of claim 1 wherein said material is removed by dry etching.

3. The process of claim 1 wherein said material is removed by reactive ion etching.

4. The process of claim 1 wherein said substrate comprises a semiconductor wafer.

5. The process of claim 4 wherein said material is removed by dry etching.

6. The process of claim 4 wherein said material is removed by reactive ion etching.

7. The process of claim 1 wherein said substrate comprises a silicon layer, a dielectric layer or a conductive metal layer of aluminum and alloys thereof.

8. The process of claim 7 wherein said material is removed by dry etching.

9. The process of claim 7 wherein said material is removed by reactive ion etching.

10. A method of forming a conductor pattern on semiconductor devices comprising
    depositing a film of a conductive metal on a surface of a semiconductor substrate having at least one integrated circuit formed therein;
    forming on said film a first masking layer of an organic polymeric material having a predetermined pattern of openings therein exposing corresponding portions of said film;
    depositing a layer of magnesium oxide on said masking layer and on the exposed portion of said metal film;
    removing said masking layer and the portions of said oxide layer deposited thereon to form a retained mask pattern of said oxide on said film having openings over said metal film complementary to the pattern of openings of said first mask pattern,
    removing the portions of said metal film exposed by said oxide mask, and
    removing said oxide mask.

11. The method of claim 10 wherein the said portions of said metal film are removed by dry etching.

12. The method of claim 10 wherein the said portions of said metal film are removed by reactive ion etching.

13. In a process for fabrication of semiconductor devices on a structure comprised of an aluminum layer on an insulating layer over a semiconductor substrate containing at least one integrated circuit therein, the steps comprising
    defining a desired pattern to be formed in said aluminum layer by a mask of magnesium oxide, and removing exposed portions of said aluminum layer to said insulating layer.

14. A process as set forth in claim 13 wherein said aluminum is removed by dry etching.

15. A process as set forth in claim 13 wherein said aluminum is removed by reactive ion etching.

16. A method of forming a conductor pattern on semiconductor devices comprising:
    depositing a film of a conductive metal on a surface of a semiconductor substrate having at least one integrated circuit formed therein;
    depositing a layer of magnesium oxide on said film;

forming on said oxide layer a masking layer of an organic polymeric material having a predetermined pattern of openings therein exposing corresponding portions of said oxide layer;

subtractively etching the exposed portions of said oxide layer to form a corresponding oxide mask;
removing the remainder of said polymeric material;
removing the portions of said metal film exposed by said oxide mask; and
removing said oxide mask.

* * * * *